United States Patent
Kim

(10) Patent No.: US 9,584,106 B2
(45) Date of Patent: Feb. 28, 2017

(54) SEMICONDUCTOR INTEGRATED CIRCUIT APPARATUS

(71) Applicant: SK hynix Inc., Icheon-si Gyeonggi-do (KR)

(72) Inventor: Dae Suk Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 16 days.

(21) Appl. No.: 14/848,429

(22) Filed: Sep. 9, 2015

(65) Prior Publication Data

US 2016/0301402 A1    Oct. 13, 2016

(30) Foreign Application Priority Data

Apr. 13, 2015   (KR) .......................... 10-2015-0051848

(51) Int. Cl.
   *G06F 1/04*      (2006.01)
   *H03K 5/135*   (2006.01)

(52) U.S. Cl.
   CPC ..................................... *H03K 5/135* (2013.01)

(58) Field of Classification Search
   None
   See application file for complete search history.

(56) References Cited

U.S. PATENT DOCUMENTS

| | | | | |
|---|---|---|---|---|
| 6,310,895 B1 * | 10/2001 | Lundh | ................... | H04J 3/0688 370/503 |
| 7,810,003 B2 * | 10/2010 | Seong | .............. | G01R 31/31855 714/724 |
| 9,222,979 B2 * | 12/2015 | Kim | ................. | G01R 31/31853 |
| 2003/0009714 A1 * | 1/2003 | Evans | .............. | G01R 31/31850 714/726 |

FOREIGN PATENT DOCUMENTS

KR    1019990069753 A    9/1999

* cited by examiner

*Primary Examiner* — Cassandra Cox
(74) *Attorney, Agent, or Firm* — William Park & Associates Ltd.

(57) ABSTRACT

A semiconductor integrated circuit apparatus may include a clock-distributing unit, an internal circuit unit and an output-controlling unit. The clock-distributing unit may drive an input clock to output a distribution clock. The internal circuit unit may generate an internal circuit output signal in response to an input signal and the distribution clock. The output-controlling unit may select one of the input clock and the distribution clock in response to a clock selection signal and an output selection signal. The output-controlling unit may synchronize the internal circuit output signal with a clock selected between the input clock and the distribution clock or bypass the internal circuit output signal to output an output signal.

11 Claims, 3 Drawing Sheets

SEMICONDUCTOR INTEGRATED CIRCUIT APPARATUS

CROSS-REFERENCES TO RELATED APPLICATION

The present application claims priority under 35 U.S.C. §119(a) to Korean application number 10-2015-0051848 filed on Apr. 13, 2015, in the Korean Intellectual Property Office, which is incorporated herein by reference in its entirety.

BACKGROUND

1. Technical Field

Various embodiments generally relate to a semiconductor integrated circuit apparatus, and more particularly to a semiconductor apparatus.

2. Related Art

Demands for high-speed electronic systems have led to many advances in synchronous semiconductor integrated circuits using high-frequency clocks.

Further, demands for mobile electronic systems have led to many advances in highly integrated semiconductor devices.

To provide highly integrated semiconductor devices, manufacturers in the semiconductor industry have continually increased packaging density, which has led to the development of three-dimensional package. As the number of stacked semiconductor dies in the three-dimensional package increases, and as the widths of signal lines decrease, the signal load may increase.

A three-dimensional package having a plurality of stacked semiconductor dies may have an interconnection line having a narrow width and long length, which may cause the signal load at the interconnection line to increase.

As a result, the semiconductor integrated circuits may not output signals synchronized with the high-frequency clocks at predetermined times.

SUMMARY

According to example embodiments, there may be provided a semiconductor circuit apparatus. The semiconductor circuit apparatus may include a clock-distributing unit, an internal circuit unit and an output-controlling unit. The clock-distributing unit may drive an input clock to output a distribution clock. The internal circuit unit may be operated in response to an input signal and the distribution clock. The internal circuit unit may output an operation result as an internal circuit output signal. The output-controlling unit may select any one of the input clock and the distribution clock in response to a clock selection signal and an output selection signal. The output-controlling unit may synchronize the internal circuit output signal with a selected clock or bypass the internal circuit output signal to output an output signal.

According to example embodiments, there may be provided a semiconductor circuit apparatus. The semiconductor circuit apparatus may include a first semiconductor die and a second semiconductor die stacked on the first semiconductor die. The first semiconductor die may transmit an input signal to the second semiconductor die. The first semiconductor die may drive an input clock to transmit the driven input clock to the second semiconductor die. The second semiconductor die may be operated in response to the input signal and the driven input clock inputted from the first semiconductor die. The second semiconductor die may transmit an operation result as an internal circuit output signal to the first semiconductor die. The first semiconductor die may determine an output timing of the internal circuit output signal in response to a clock selection signal and an output selection signal. The first semiconductor die may output the internal circuit output signal at a determined output timing.

According to example embodiments, a semiconductor integrated circuit apparatus may include a clock-distributing unit, an internal circuit unit, and an output-controlling unit. The clock-distributing unit may receive an input clock from outside semiconductor integrated circuit apparatus, and generate a distribution clock using the input clock. The internal circuit unit may receive an input signal from outside semiconductor integrated circuit apparatus, and generate an internal circuit output signal in response to the input signal and the distribution clock. An output-controlling unit may select one of the input clock and the distribution clock in response to a clock selection signal and an output selection signal, and generate an output signal, an output timing of which is selected between a plurality of output timings, a first output timing occurring when the output signal is generated by synchronizing the internal circuit output signal with the input clock, a second output timing occurring when the output signal is generated by synchronizing the internal circuit output signal with the distribution clock, and a third output timing occurring when the output signal is generated by bypassing the internal circuit output signal to output the internal circuit output signal as the output signal.

BRIEF DESCRIPTION OF THE DRAWINGS

Example embodiments can be understood in more detail from the following detailed description taken in conjunction with the accompanying drawings.

FIG. 1 is a block diagram illustrating a semiconductor integrated circuit apparatus in accordance with example embodiments;

FIG. 2 is a block diagram illustrating an output-controlling unit in FIG. 1; and FIG. 3 is a block diagram illustrating a semiconductor integrated circuit apparatus in accordance with example embodiments.

DETAILED DESCRIPTION

Figure 1:
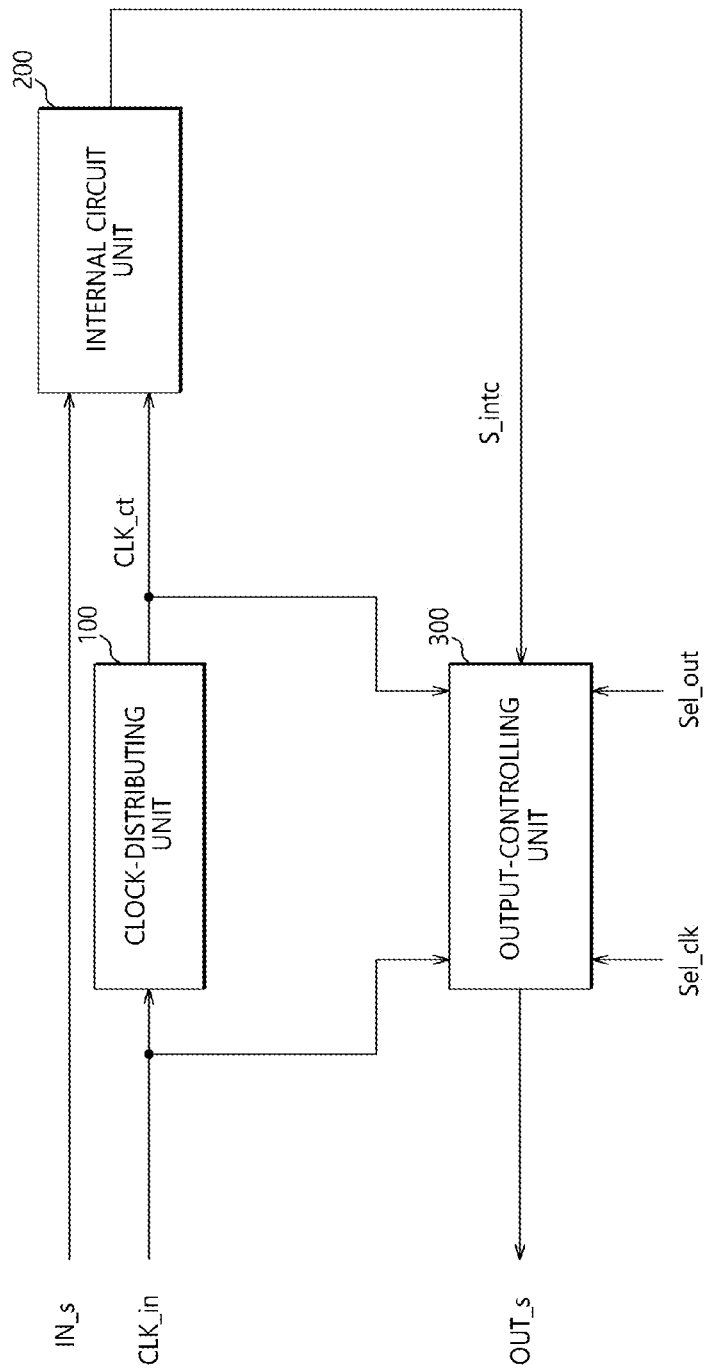
FIGS. 1 to 3 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a block diagram illustrating a semiconductor integrated circuit apparatus in accordance with example embodiments.

Referring to FIG. 1, a semiconductor integrated circuit apparatus in accordance with an example embodiment may include a clock-distributing unit 100, an internal circuit unit 200 and an output-controlling unit 300.

The clock-distributing unit 100 may drive an input clock CLK_in to generate a distribution clock CLK_ct. For example, the clock-distributing unit 100 may generate the distribution clock CLK_ct such that its phase is appropriate to be used in the internal circuit unit 200. The clock-distribution unit 100 may generate other distribution clocks (not shown) suitable for other internal circuit units (not shown). The clock-distributing unit 100 may transmit the input clock CLK_in from an input position of the input clock CLK_in to the internal circuit unit 200. The clock-distributing unit 100 may include a clock tree (not shown).

The internal circuit unit 200 may also receive an input signal IN_s. The internal circuit unit 200 may operate in response to the input signal IN_s and the distribution clock CLK_ct. For example, the internal circuit unit 200 may generate an internal circuit output signal S_intc in response to the input signal IN_s and the distribution clock CLK_ct. For example, the internal circuit unit 200 may store the input signal IN_s in response to the distribution clock CLK_ct. The internal circuit unit 200 may include flip-flops (not shown) to store the input signal IN_s and output the stored input signal IN_s as an output signal output signal S_intc.

The output-controlling unit 300 may synchronize the internal circuit output signal S_intc with one of the input clock CLK_in and the distribution clock CLK_ct in response to a clock selection signal Sel_clk and an output selection signal Sel_out. The output-controlling unit 300 may then selectively output the synchronized internal circuit output signal S_intc or the internal circuit output signal S_intc as the output signal OUT_s. For example, the output-controlling unit 300 may select one of the input clock CLK_in and the distribution clock CLK_ct in response to the clock selection signal Sel_clk. When the synchronized internal circuit output signal S_intc is outputted as the output signal OUT_s, the output-controlling unit 300 may synchronize, in response to the output selection signal Sel_out, the internal circuit output signal S_intc with the clock selected between the input clock CLK_in and the distribution clock CLK_ct to output the synchronized internal circuit output signal S_intc as the output signal OUT_s. When the internal circuit output signal S_intc is outputted as the output signal OUT_s, the output-controlling unit 300 may bypass the internal circuit output signal S_intc to output the bypassed internal circuit output signal S_intc as the output signal OUT_s. The clock selection signal Sel_clk and the output selection signal Sel_out may correspond to an output signal of a fuse circuit or a mode register set.

Figure 2:
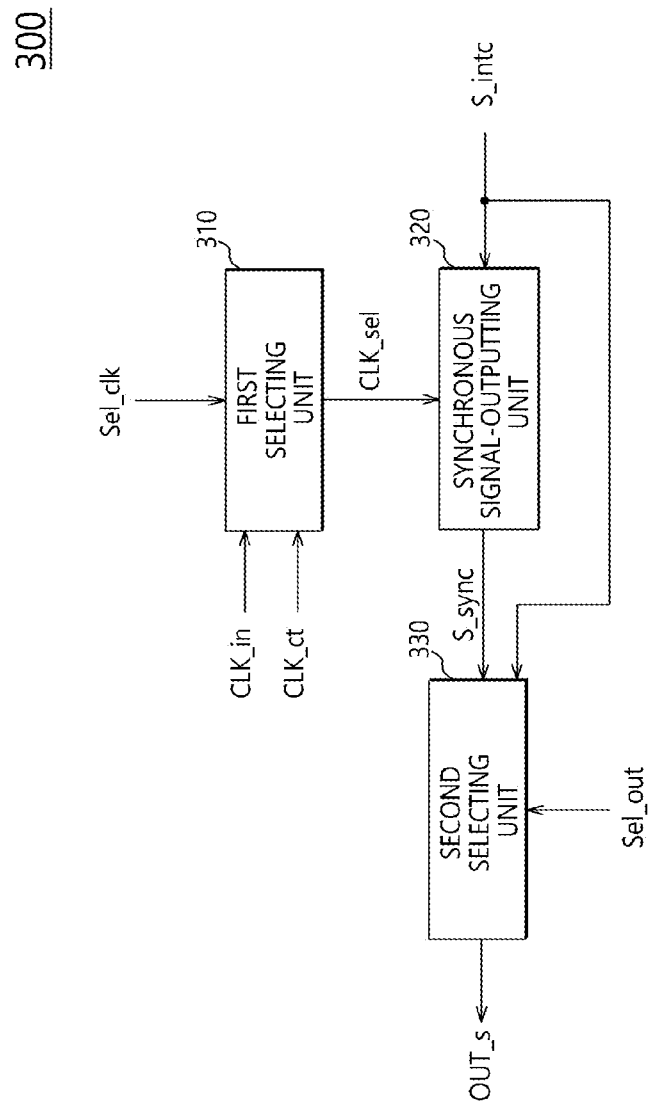

Referring to FIG. 2, the output-controlling unit 300 may include a first selecting unit 310, a synchronous signal-outputting unit 320, and a second selecting unit 330.

The first selecting unit 310 may output one of the input clock CLK_in and the distribution clock CLK_ct as a selection clock CLK_sel in response to the clock selection signal Sel_clk. For example, when the clock selection signal Sel_clk is disabled, the first selecting unit 310 may output the distribution clock CLK_ct as the selection clock CLK_sel. When the clock selection signal Sel_clk is enabled, the first selecting unit 310 may output the input clock CLK_in as the selection clock CLK_sel. The first selecting unit 310 may include a multiplexer.

The synchronous signal-outputting unit 320 may output the internal circuit output signal S_intc as a synchronous signal S_sync in response to the selection clock CLK_sel. For example, the synchronous signal-outputting unit 320 may synchronize the internal circuit output signal S_intc with the selection clock CLK_sel to output the synchronized internal circuit output signal S_intc as the synchronous signal S_sync. When the selection clock CLK_sel has a specific level, the synchronous signal-outputting unit 320 may receive and store the internal circuit output signal S_intc, and then output the stored internal circuit output signal S_intc. The synchronous signal-outputting unit 320 may include a flip-flop to synchronize the internal circuit output signal S_intc with the selection clock CLK_sel and output the synchronized internal circuit output signal S_intc as the synchronous signal S_sync.

The second selecting unit 330 may output one of the synchronous signal S_sync and the internal circuit output signal S_intc as the output signal OUT_s in response to the output selection signal Sel_out. For example, when the output selection signal Sel_out is disabled, the second selecting unit 330 may output the synchronous signal S_sync as the output signal OUT_s. When the output selection signal Sel_out is enabled, the second selecting unit 330 may output the internal circuit output signal S_intc as the output signal OUT_s. The second selecting unit 330 may include a multiplexer.

Referring to FIGS. 1 and 2, a semiconductor integrated circuit apparatus in accordance with an example embodiment may operate as follows.

The clock-distributing unit 100 may drive the input clock CLK_in to output the driven input clock CLK_in as the distribution clock CLK_ct.

The internal circuit unit 200 may synchronize the input signal IN_s with the distribution clock CLK_ct to output the synchronized input signal IN_s as the internal circuit output signal S_intc.

The output-controlling unit 300 may select one of the input clock CLK_in and the distribution clock CLK_ct in response to the clock selection signal Sel_clk and the output selection signal Sel_out. The output-controlling unit 300 may synchronize the internal circuit output signal S_intc with a selected clock, and then output the synchronized internal circuit output signal S_intc as the output signal OUT_s. Alternatively, the output-controlling unit 300 may bypass the internal circuit output signal S_intc to output the bypassed internal circuit output signal S_intc as the output signal OUT_s.

When the clock selection signal Sel_clk is disabled, the output-controlling unit 300 may select the distribution clock CLK_ct. When the output selection signal Sel_out is disabled, the output-controlling unit 300 may synchronize the internal circuit output signal S_intc with the selected distribution clock CLK_ct to output the synchronized internal circuit output signal S_intc as the output signal OUT_s.

When the clock selection signal Sel_clk is enabled, the output-controlling unit 300 may select the input clock CLK_in. When the output selection signal Sel_out is disabled, the output-controlling unit 300 may synchronize the internal circuit output signal S_intc with the selected input clock CLK_in to output the synchronized internal circuit output signal S_intc as the output signal OUT_s.

When the clock selection signal Sel_clk is disabled, the output-controlling unit 300 may select the distribution clock CLK_ct. When the output selection signal Sel_out is enabled, the output-controlling unit 300 may bypass the internal circuit output signal S_intc to output the bypassed internal circuit output signal S_intc as the output signal OUT_s.

When the clock selection signal Sel_clk is enabled, the output-controlling unit 300 may select the input clock CLK_in. When the output selection signal Sel_out is enabled, the output-controlling unit 300 may bypass the internal circuit output signal S_intc to output the bypassed internal circuit output signal S_intc as the output signal OUT_s.

When the output selection signal Sel_out is enabled, the internal circuit output signal S_intc may be bypassed regardless of the clock selected by the clock selection signal Sel_clk. The bypassed internal circuit output signal S-intc may then be outputted as the output signal OUT_s.

When the output selection signal Sel_out is disabled, one of the input clock CLK_in and the distribution clock CLK_ct may be selected in response to the clock selection signal Sel_clk. The internal circuit output signal S_intc may be synchronized with the clock selected between the input clock CLK_in and the distribution clock CLK_ct. Here, an output timing of the output signal OUT_s that is generated by synchronizing the internal circuit output signal S_intc with the input clock CLK_in may be faster than an output timing of the output signal OUT_s that is generated by synchronizing the internal circuit output signal S_intc with the distribution clock CLK_ct. When the input clock CLK_in inputted into the clock-distributing unit 100 is outputted as the distribution clock CLK_ct, the phase of the input clock CLK_in may precede that of the distribution clock CLK_ct because it takes time for the distribution clock CLK_ct to be generated at the clock-distributing unit 100.

When the output selecting signal Sel_out is enabled, the internal circuit output signal S_intc may be bypassed and then outputted as the output signal OUT_s. An output timing of the output signal OUT_s in this situation may be faster than an output timing of the output signal OUT_s that is generated by synchronizing the internal circuit output signal S_intc with one of the input clock CLK_in and the distribution clock CLK_ct.

That is, the fastest output timing of the output signal OUT_s may occur when the internal circuit output signal S_intc is bypassed to be outputted as the output signal OUT_s in a situation where the output selection signal Sel_out is enabled. The second fastest output timing of the output signal OUT_s may occur when the internal circuit output signal S_intc is synchronized with the input clock CLK_in to be outputted as the output signal OUT_s in a situation where the output selection signal Sel_out is disabled and the clock selection signal Sel_clk is enabled. The slowest output timing of the output signal OUT_s may occur when the internal circuit output signal S_intc is synchronized with the distribution clock CLK_ct to be outputted as the output signal OUT_s in a situation where the output selection signal Sel_out is disabled and the clock selection signal Sel_clk is disabled.

According to an example embodiment, the semiconductor integrated circuit apparatus may control the output timing of the output signal by selecting one of the clocks or by outputting the output signal without the synchronization of the output signal with the clock.

Figure 3:
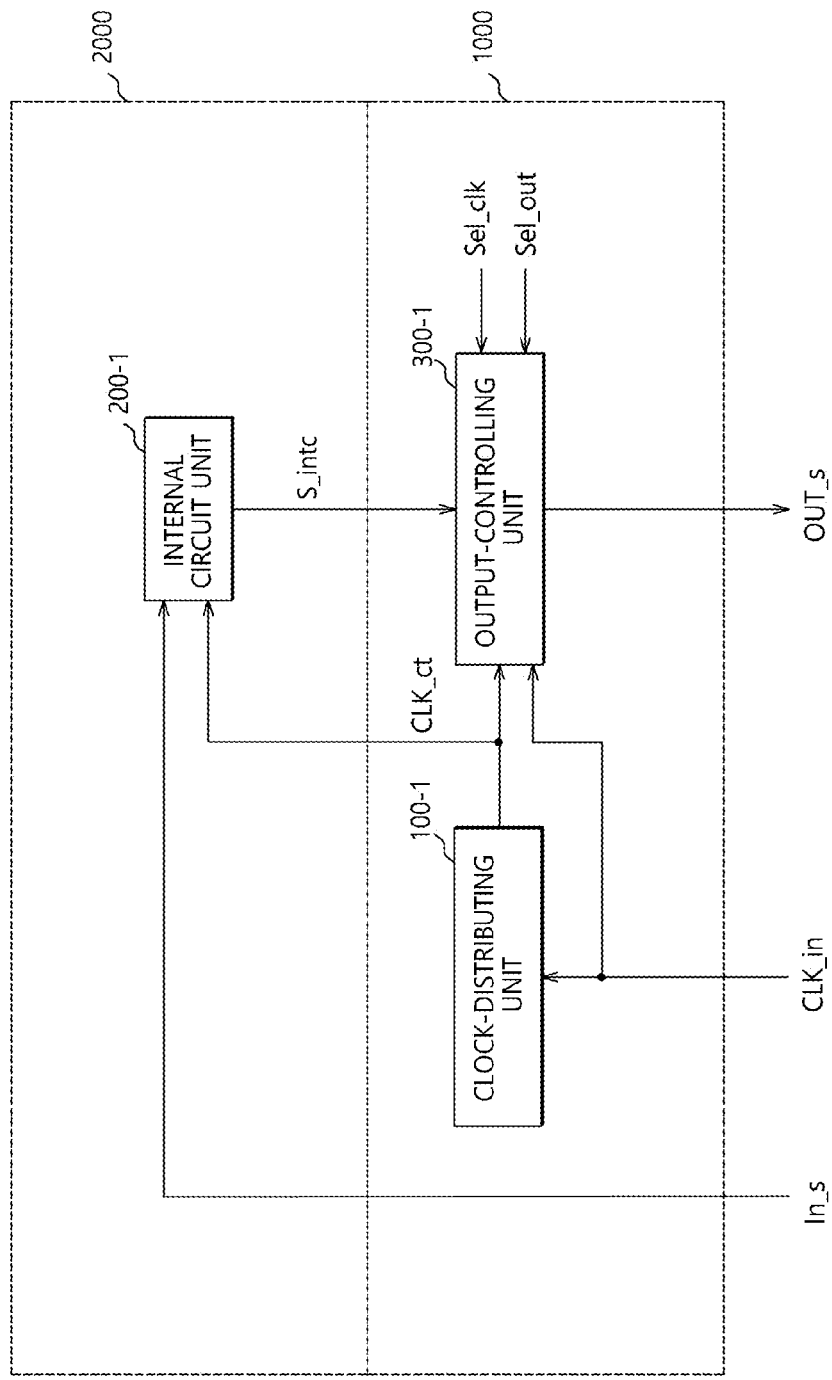

Referring to FIG. 3, a semiconductor integrated circuit apparatus in accordance with an example embodiment may include a first semiconductor die 1000 and a second semiconductor die 2000. The second semiconductor die 2000 may be stacked on the first semiconductor die 1000.

The first semiconductor die 1000 may transmit signals IN_s and CLK_in inputted from outside the semiconductor apparatus to the second semiconductor die 2000. The first semiconductor die 1000 may output signals S_intc, which is outputted from the second semiconductor die 2000, to the outside. For example, the first semiconductor die 1000 may transmit a portion of the signals IN_s, which is inputted from the outside, to the second semiconductor die 2000. The first semiconductor die 1000 may drive the rest of the signals IN_s. The first semiconductor die 1000 may transmit the driven signals IN_s to the second semiconductor die 2000. That is, the first semiconductor die 1000 may transmit the input signals IN_s to the second semiconductor die 2000.

The first semiconductor die 1000 may include a clock-distributing unit 100-1 and an output-controlling unit 300-1.

The clock-distributing unit 100-1 may drive an input clock CLK_in to generate a distribution clock CLK_ct. The clock-distributing unit 100-1 may transmit the driven input clock to the second semiconductor die 2000 and the output-controlling unit 300-1.

The output-controlling unit 300-1 may determine an output timing of an output signal S_intc, which is outputted from the second semiconductor die 2000, in response to a clock selection signal Sel_clk and an output selection signal Sel_out to output an output signal OUT_s.

The second semiconductor die 2000 may include an internal circuit unit 200-1. The internal circuit unit 200-1 may operate in response to the input signal IN_s and the distribution clock CLK_ct inputted from the first semiconductor die 1000, and generate the internal circuit output signal S_intc to provide it to the first semiconductor die 1000.

The clock-distributing unit 100-1, the internal circuit unit 200-1 and the output-controlling unit 300-1 in FIG. 3 may be substantially the same as the clock-distributing unit 100, the internal circuit unit 200 and the output controlling unit 300 in FIGS. 1 and 2, respectively.

Referring to FIG. 3, a semiconductor integrated circuit apparatus in accordance with an example embodiment may operate as follows.

The first semiconductor die 1000 may transmit the input signal IN_s to the second semiconductor die 2000. The first semiconductor die 1000 may drive the input clock CLK_in to transmit the driven input clock CLK_in as the distribution clock CLK_ct to the second semiconductor die 200. For example, the clock-distributing unit 100-1 of the first semiconductor die 1000 may drive the input clock CLK_in to transmit the driven input clock CLK_in as the distribution clock CLK_ct to the second semiconductor die 2000.

The second semiconductor die 2000 may operate in response to the input signal IN_s and the distribution clock CLK_ct inputted from the first semiconductor die 1000 to output the internal circuit output signal S_intc to the first semiconductor die 1000. For example, when the internal circuit unit 200-1 of the second semiconductor die 2000 includes a flip-flop, the internal circuit unit 200-1 may synchronize the input signal IN_s with the distribution clock CLK_ct. The internal circuit unit 200-1 may output the synchronized input signal IN_s as the internal circuit output signal S_intc to the first semiconductor die 1000.

The first semiconductor die 1000 may control an output timing of the output signal OUT_s when the internal circuit output signal S_intc is outputted as the output signal OUT_s in response to the clock selection signal Sel_clk and the output selection signal Sel_out. For example, the output-controlling unit 300-1 of the first semiconductor die 1000 may select one of the input clock CLK_in and the distribution clock CLK_ct in response to the clock selection signal Sel_clk. The output-controlling unit 300-1 may synchronize the internal circuit output signal S_intc with the clock selected between the input clock CLK_in and the distribution clock CLK_ct. The output-controlling unit 300-1 may output the synchronized internal circuit output signal S_intc as the output signal OUT_s. Alternatively, the output-controlling unit 300-1 may bypass the internal circuit output signal S_intc to output the bypassed internal circuit output signal S_intc as the output signal OUT_s.

When the clock selection signal Sel_clk is disabled, the output-controlling unit 300-1 of the first semiconductor die 1000 may select the distribution clock CLK_ct. When the output selection signal Sel_out is disabled, the output-controlling unit 300-1 may synchronize the internal circuit output signal S_intc with the distribution clock CLK_ct. The output-controlling unit 300-1 may then output the synchronized internal circuit output signal S_intc as the output signal OUT_s.

When the clock selection signal Sel_clk is enabled, the output-controlling unit 300-1 may select the input clock CLK_in. When the output selection signal Sel_out is disabled, the output-controlling unit 300-1 may synchronize the internal circuit output signal S_intc with the input clock CLK_in. The output-controlling unit 300-1 may then output the synchronized internal circuit output signal S_intc as the output signal OUT_s.

When the output selection signal Sel_out is enabled, the output-controlling unit 300-1 may bypass the internal circuit output signal S_intc regardless of which clock has been selected by the clock selection signal Sel_clk. The output-controlling unit 300-1 may output the internal circuit output signal S-intc as the output signal OUT_s.

That is, the fastest output timing of the output signal OUT_s may occur when the internal circuit output signal S_intc is bypassed to be outputted as the output signal OUT_s in a situation where the output selection signal Sel_out is enabled. The second fastest output timing of the output signal OUT_s may occur when the internal circuit output signal S_intc is synchronized with the input clock CLK_in to be outputted as the output signal OUT_s in a situation where the output selection signal Sel_out is disabled and the clock selection signal Sel_clk is enabled. The slowest output timing of the output signal OUT_s may occur when the internal circuit output signal S_intc is synchronized with the distribution clock CLK_ct to be outputted as the output signal OUT_s in a situation where the output selection signal Sel_out is disabled and the clock selection signal Sel_clk is disabled.

According to an example embodiment, the semiconductor integrated circuit apparatus may control the output timings of the output signals, which are outputted from the different semiconductor dies, by selecting one of the clocks or by outputting the output signals without the synchronization of the output signals with the clock.

Thus, even if a loading of an interconnection line through which a signal passes increases due to the increase in the number of semiconductor dies in a highly integrated semiconductor device, each semiconductor die therein may accurately output a signal at a predetermined timing.

While various embodiments have been described above, it will be understood to those skilled in the art that the embodiments described are by way of example only. Accordingly, the circuit and method described herein should not be limited based on the described embodiments.

What is claimed is:

1. A semiconductor integrated circuit apparatus comprising:
    a clock-distributing unit configured to drive an input clock and output the driven input clock as a distribution clock;
    an internal circuit unit configured to generate an internal circuit output signal in response to an input signal and the distribution clock; and
    an output-controlling unit configured to select one of the input clock and the distribution clock in response to a clock selection signal and an output selection signal, and synchronize the internal circuit output signal with a clock selected between the input clock and the distribution clock to output the synchronized internal output signal as an output signal or bypass the internal circuit output signal to output the internal circuit output signal as the output signal.

2. The semiconductor integrated circuit apparatus of claim 1, wherein the internal circuit unit comprises a flip-flop configured to synchronize the input signal with the distribution clock and output a synchronized input signal as the internal circuit output signal.

3. The semiconductor integrated circuit apparatus of claim 1, wherein the output-controlling unit selects one of the input clock and the distribution clock in response to the clock selection signal, and synchronizes the internal circuit output signal with the clock selected between the input clock and the distribution clock to output the synchronized internal output signal as the output signal in response to the output selection signal or bypass the internal circuit output signal to output the bypassed internal circuit output signal as the output signal in response to the output selection signal.

4. The semiconductor integrated circuit apparatus of claim 1, wherein the output-controlling unit comprises:
    a first selecting unit configured to output one of the input clock and the distribution clock as a selection clock in response to the clock selection signal;
    a synchronous signal-outputting unit configured to synchronize the internal circuit output signal with the selection clock and output the synchronized internal circuit output signal; and
    a second selecting unit configured to output one of the synchronized internal circuit output signal and the internal circuit output signal in response to the output selection signal.

5. A semiconductor integrated circuit apparatus comprising:
    a first semiconductor die; and
    a second semiconductor die stacked on the first semiconductor die,
    wherein the first semiconductor die transmits an input signal to the second semiconductor die, and the first semiconductor die drives an input clock and transmits the driven input clock to the second semiconductor die, wherein the second semiconductor die generates an internal circuit output signal to be transmitted to the first semiconductor die in response to the input signal and the driven clock inputted from the first semiconductor die, and wherein the first semiconductor die determines an output timing of the internal circuit output signal in response to a clock selection signal and an output selection signal, and outputs the internal output signal as an output signal at a determined output timing.

6. The semiconductor integrated circuit apparatus of claim 5, wherein the first semiconductor die comprises:
   a clock-distributing unit configured to drive the input clock and output the driven input clock as a distribution clock to the second semiconductor die; and
   an output-controlling unit configured to select the output timing of the internal circuit output signal in response to the clock selection signal and the output selection signal, and output the internal output signal as the output signal at the determined output timing.

7. The semiconductor integrated circuit apparatus of claim 6, wherein the output-controlling unit comprises:
   a first selecting unit configured to output one of the input clock and the distribution clock as a selection clock in response to the clock selection signal;
   a synchronous signal-outputting unit configured to synchronize the internal circuit output signal with the selection clock and output the synchronized internal circuit output signal; and
   a second selecting unit configured to output one of the synchronized internal circuit output signal and the internal circuit output signal in response to the output selection signal.

8. The semiconductor integrated circuit apparatus of claim 5, wherein the second semiconductor die comprises an internal circuit unit configured to synchronize the input signal with the driven clock and output a synchronized input signal as the internal circuit output signal.

9. A semiconductor integrated circuit apparatus comprising:
   a clock-distributing unit configured to receive an input clock from outside semiconductor integrated circuit apparatus, and generate a distribution clock using the input clock;
   an internal circuit unit configured to receive an input signal from outside semiconductor integrated circuit apparatus, and generate an internal circuit output signal in response to the input signal and the distribution clock; and
   an output-controlling unit configured to select one of the input clock and the distribution clock in response to a clock selection signal and an output selection signal, and generate an output signal, an output timing of which is selected between a plurality of output timings, a first output timing occurring when the output signal is generated by synchronizing the internal circuit output signal with the input clock, a second output timing occurring when the output signal is generated by synchronizing the internal circuit output signal with the distribution clock, and a third output timing occurring when the output signal is generated by bypassing the internal circuit output signal to output the internal circuit output signal as the output signal.

10. The semiconductor integrated circuit apparatus of claim 9, wherein the internal circuit unit comprises a flip-flop configured to synchronize the input signal with the distribution clock and output a synchronized input signal as the internal circuit output signal.

11. The semiconductor integrated circuit apparatus of claim 9, wherein the output-controlling unit comprises:
   a first selecting unit configured to output one of the input clock and the distribution clock as a selection clock in response to the clock selection signal;
   a synchronous signal-outputting unit configured to synchronize the internal circuit output signal with the selection clock and output the synchronized internal circuit output signal; and
   a second selecting unit configured to output one of the synchronized internal circuit output signal and the internal circuit output signal in response to the output selection signal.

* * * * *